(12) United States Patent
Tirri et al.

(10) Patent No.: US 11,887,881 B2
(45) Date of Patent: Jan. 30, 2024

(54) LITHOGRAPHIC APPARATUS, SUBSTRATE TABLE, AND NON-UNIFORM COATING METHOD

(71) Applicant: ASML HOLDING N.V., Veldhoven (NL)

(72) Inventors: Bruce Tirri, Brookfield, CT (US); Ping Zhou, Wilton, CT (US); Elizabeth Mary Stone, Stamford, CT (US); David Hart Peterson, Milford, CT (US); Mehmet Ali Akbas, Cheshire, CT (US); Ryan Mayer, Trumbull, CT (US); Richard Bryan Lewis, Rye, NY (US)

(73) Assignee: ASML HOLDING N.V., Veldhoven (NL)

( * ) Notice: Subject to any disclaimer, the term of this patent is extended or adjusted under 35 U.S.C. 154(b) by 270 days.

(21) Appl. No.: 17/608,238

(22) PCT Filed: Apr. 21, 2020

(86) PCT No.: PCT/EP2020/061098
§ 371 (c)(1),
(2) Date: Nov. 2, 2021

(87) PCT Pub. No.: WO2020/224953
PCT Pub. Date: Nov. 12, 2020

(65) Prior Publication Data
US 2022/0216092 A1    Jul. 7, 2022

Related U.S. Application Data

(60) Provisional application No. 62/844,384, filed on May 7, 2019.

(51) Int. Cl.
*G03F 7/00* (2006.01)
*H01L 21/687* (2006.01)
*C23C 16/513* (2006.01)

(52) U.S. Cl.
CPC ...... *H01L 21/68735* (2013.01); *C23C 16/513* (2013.01); *G03F 7/707* (2013.01); *G03F 7/70783* (2013.01); *H01L 21/68757* (2013.01)

(58) Field of Classification Search
CPC .. G03F 7/70691; G03F 7/707; G03F 7/70708; G03F 7/70783; H01L 21/68757; H01L 21/68714; H01L 21/687
See application file for complete search history.

(56) References Cited

U.S. PATENT DOCUMENTS

| | | | | |
|---|---|---|---|---|
| 6,898,011 B2 * | 5/2005 | Kandaka | ............... | G21K 1/062 430/5 |
| 7,511,799 B2 | 3/2009 | Tel et al. | | |

(Continued)

FOREIGN PATENT DOCUMENTS

| | | | |
|---|---|---|---|
| KR | 20120008141 A | * | 1/2012 |
| WO | 2018007498 | | 1/2018 |

OTHER PUBLICATIONS

Machine translation of KR 20120008141 A (Year: 2012).*

(Continued)

*Primary Examiner* — Steven Whitesell Gordon
(74) *Attorney, Agent, or Firm* — Pillsbury Winthrop Shaw Pittman, LLP

(57) ABSTRACT

A method of fabricating a substrate table includes supporting a table base and disposing a coating on a surface of the table base. The surface of the table base is substantially flat. The coating has a non-uniform thickness. The coating exerts a stress on the table so as to bend the table base. The non-uniform thickness causes a surface of the coating to become substantially flat after the bending.

20 Claims, 7 Drawing Sheets

(56) References Cited

U.S. PATENT DOCUMENTS

2011/0310524 A1* 12/2011 Six .................. G03F 7/70783
361/234
2019/0086816 A1   3/2019 Krol et al.

OTHER PUBLICATIONS

J. B. Oliver, J. Spaulding, and B. Charles, "Stress Compensation by Deposition of a Nonuniform Corrective Coating," in Optical Interference Coatings Conference (OIC) 2019, OSA Technical Digest (Optica Publishing Group, 2019), paper WC.2. (Year: 2019).*
International Search Report and Written Opinion issued in corresponding PCT Patent Application No. PCT/EP2020/061098, dated Jul. 31, 2020.

* cited by examiner

LITHOGRAPHIC APPARATUS, SUBSTRATE TABLE, AND NON-UNIFORM COATING METHOD

CROSS-REFERENCE TO RELATED APPLICATIONS

This application is the U.S. national phase entry of PCT Patent Application No. PCT/EP2020/061098 which was filed on Apr. 2, 2020, which claims the benefit of priority of U.S. Provisional Patent Application No. 62/844,384, which was filed on May 7, 2019, and which is incorporated herein in its entirety by reference.

FIELD

The present disclosure relates to substrate tables and table coatings, and methods of employing a coating with non-uniform thickness on a substrate table for lithographic apparatuses and systems.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

Another lithographic system is an interferometric lithographic system where there is no patterning device, but rather a light beam is split into two beams, and the two beams are caused to interfere at a target portion of the substrate through the use of a reflection system. The interference causes lines to be formed at the target portion of the substrate.

During lithographic operation, different processing steps may require different layers to be sequentially formed on the substrate. Accordingly, it can be necessary to position the substrate relative to prior patterns formed thereon with a high degree of accuracy. Generally, alignment marks are placed on the substrate to be aligned and are located with reference to a second object. A lithographic apparatus may use an alignment apparatus for detecting positions of the alignment marks and for aligning the substrate using the alignment marks to ensure accurate exposure from a mask. Misalignment between the alignment marks at two different layers is measured as overlay error.

In order to monitor the lithographic process, parameters of the patterned substrate are measured. Parameters may include, for example, the overlay error between successive layers formed in or on the patterned substrate and critical linewidth of developed photosensitive resist. This measurement can be performed on a product substrate and/or on a dedicated metrology target. There are various techniques for making measurements of the microscopic structures formed in lithographic processes, including the use of scanning electron microscopes and various specialized tools. A fast and non-invasive form of a specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Spectroscopic scatterometers direct a broadband radiation beam onto the substrate and measure the spectrum (intensity as a function of wavelength) of the radiation scattered into a particular narrow angular range. By contrast, angularly resolved scatterometers use a monochromatic radiation beam and measure the intensity of the scattered radiation as a function of angle.

Such optical scatterometers can be used to measure parameters, such as critical dimensions of developed photosensitive resist or overlay error (OV) between two layers formed in or on the patterned substrate. Properties of the substrate can be determined by comparing the properties of an illumination beam before and after the beam has been reflected or scattered by the substrate.

A substrate table on which a substrate is supported during lithographic and metrology processes requires a flatness tolerance that can be difficult to meet. Wafers (e.g., semiconductor substrate), being relatively thin (e.g., <1 mm thick) compared to a width of its surface area (e.g., >100 mm), are particularly sensitive to unevenness of the substrate table. A warping of a substrate table, even in the order of fractions of a micron, can adversely impact subsequent lithographic and metrology processes performed while using the substrate table. It is desirable to develop fabrication methods that can cope with warping of substrate tables and that are faster and more efficient than other polishing or area-flattening techniques.

SUMMARY

In some embodiments, a method for of fabricating a substrate table comprises supporting a table base to receive a coating and disposing the coating on a surface of the table base. The surface of the table base is substantially flat. The coating has a non-uniform thickness. The coating exerts a stress on the table so as to bend the table base. The non-uniform thickness causes a surface of the coating to become substantially flat after the bending.

In some embodiments, a substrate table for supporting a substrate comprises a table base and a coating. The coating has a non-uniform thickness and is disposed on the surface of the table base. A deflection of the table base from a nominal flatness is a function of stress caused by the coating. A cross-section profile of the coating is based on at least the stress and the non-uniform thickness. A surface of the coating is substantially flat. The surface of the coating is configured to contact a substrate when the substrate table supports the substrate.

In some embodiments, a lithographic apparatus comprises an illumination system, a support, a projection system, and a substrate table. The substrate table comprises a table base. The table base comprises a surface and a coating. The illumination system is configured to produce a beam of radiation. The support is configured to support a patterning device. The patterning device is configured to impart a pattern on the beam. The projection system is configured to project the patterned beam onto a substrate. The substrate table is configured to support the substrate. The coating is disposed on the surface of the table base. The coating has a non-uniform thickness. A deflection of the table base from a nominal flatness is a function of a stress caused by the coating. A cross-section profile of the coating is based on at least the stress and the non-uniform thickness. A surface of the coating is substantially flat. The surface of the coating is configured to contact the substrate when the substrate table supports the substrate.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 6A:
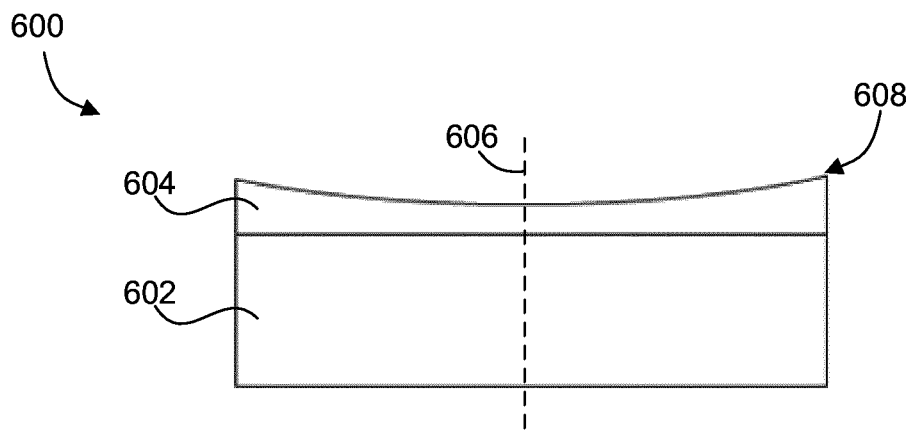
Figure 6B:
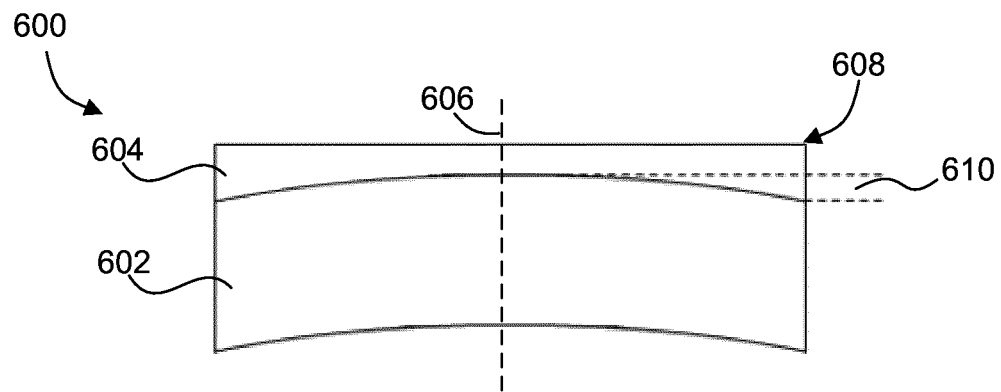
Figure 7:
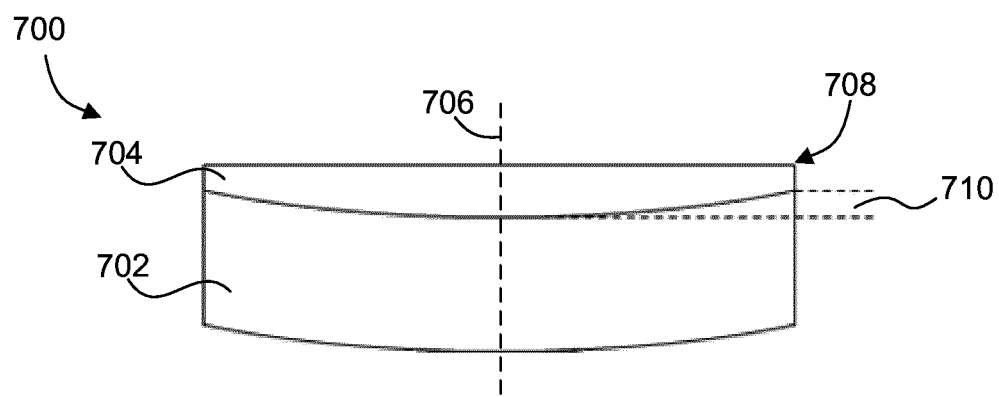

FIGS. 6A, 6B, and 7 show schematics of substrate tables, according to one or more embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure can be implemented.

Example Lithographic Systems

Figure 1A:
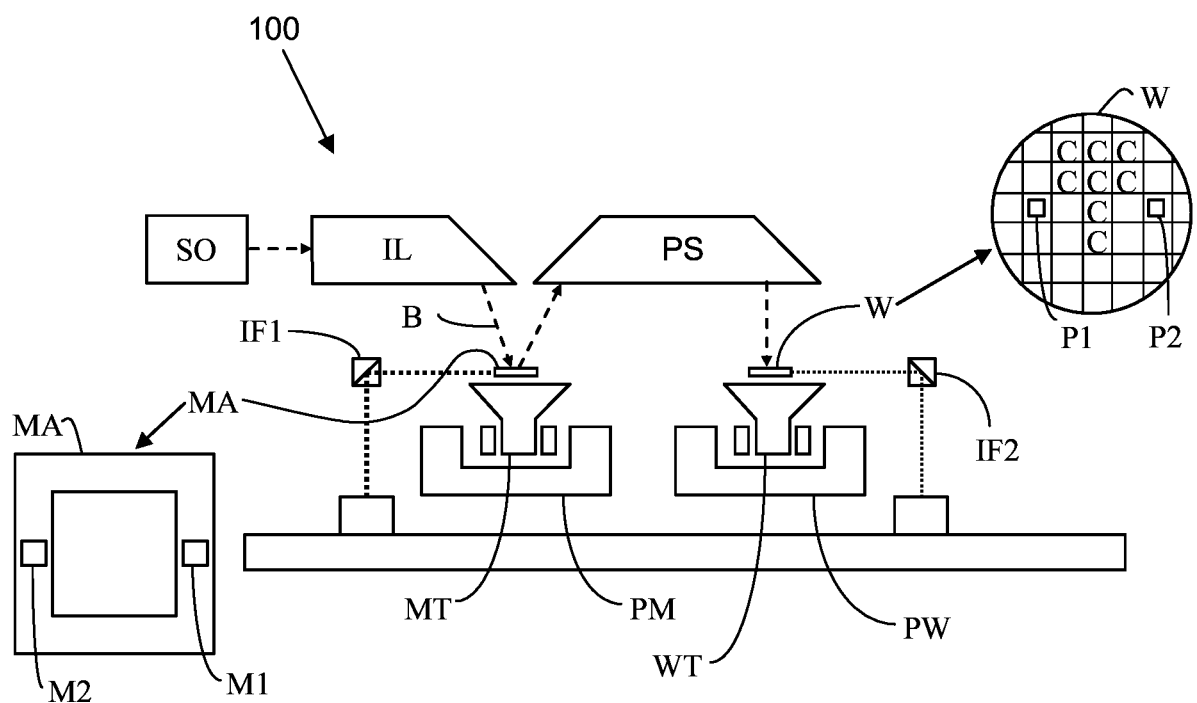
FIG. 1A shows a schematic of a reflective lithographic apparatus, according to some embodiments.
Figure 1B:
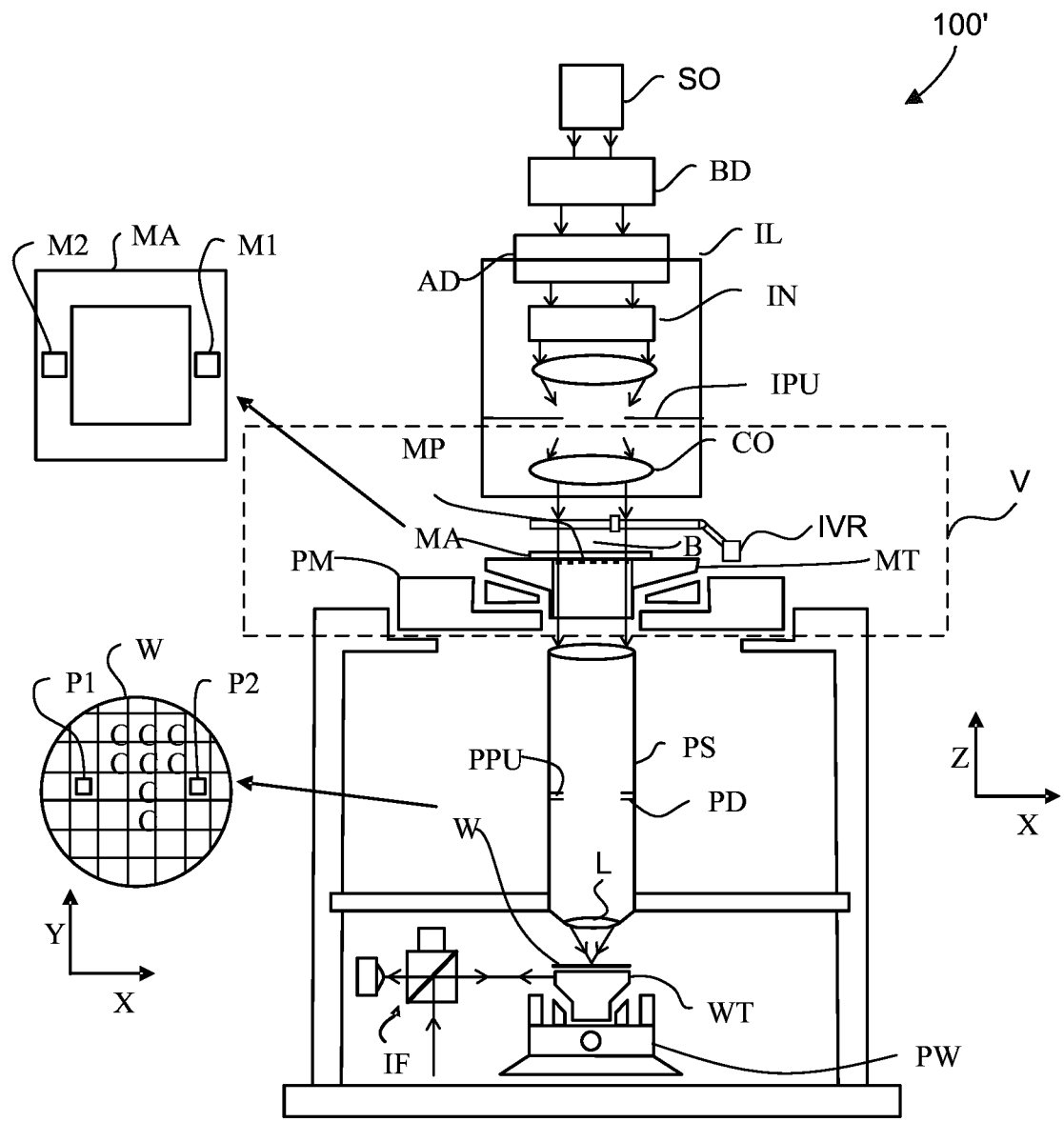
FIG. 1B shows a schematic of a transmissive lithographic apparatus, according to some embodiments.

FIGS. 1A and 1B show schematic illustrations of a lithographic apparatus 100 and lithographic apparatus 100', respectively, in which embodiments of the present disclosure can be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL can include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA can be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus can also be of a type wherein at least a portion of the substrate can be covered by a liquid having a relatively high refractive index, e.g., water, so as to fill a space between the projection system and the substrate. An immersion liquid can also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100', for example, when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP can include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration can be reduced by providing radiation poles (not shown) in opposite quadrants of the illumination system pupil IPU. Further, in some embodiments, astigmatism aberration can be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots should be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
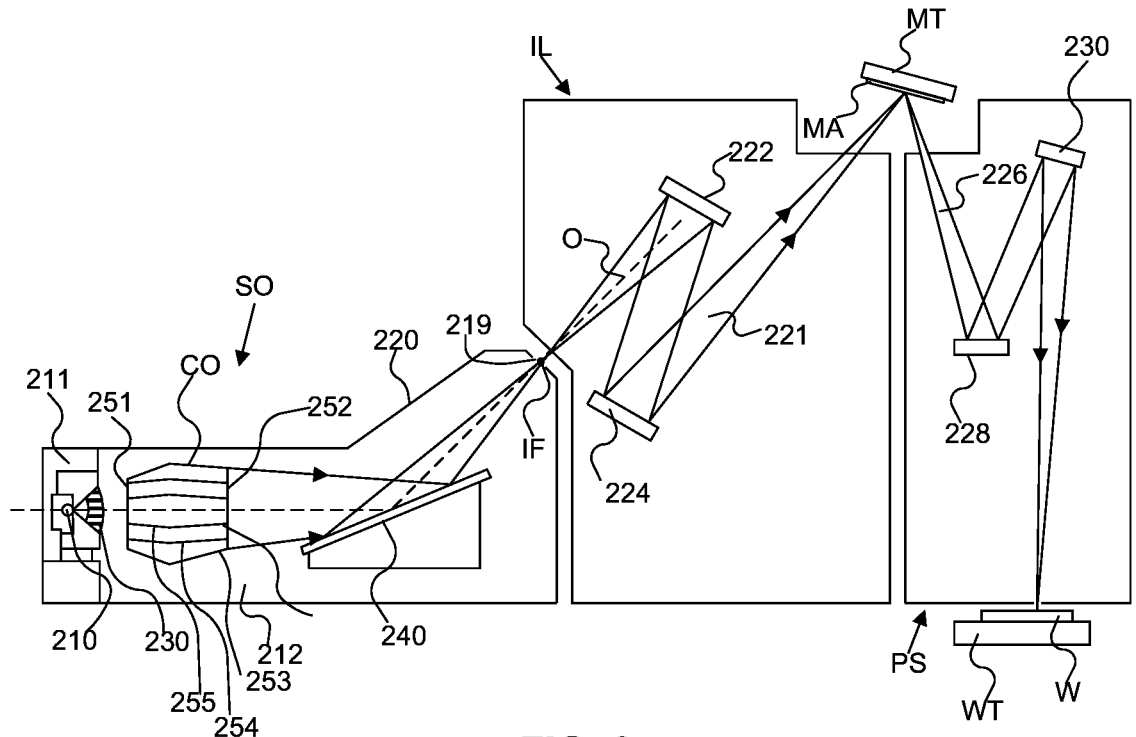
FIG. 2 shows a more detailed schematic of the reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 can be formed by a discharge produced plasma source. EUV radiation can be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor can be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 can include a channel structure. Contamination trap 230 can also include a gas barrier or a combination of a gas barrier and a channel structure. The contaminant trap 230 (or contaminant barrier) further indicated herein at least includes a channel structure.

The collector chamber 212 can include a radiation collector CO, which can be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which can include a faceted field mirror device 222 and a faceted pupil mirror device 224 arranged to provide a desired angular distribution of beam of radiation 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination optics unit IL and projection system PS. The grating spectral filter 240 can optionally be present, depending upon the type of lithographic apparatus. Further, there can be more mirrors present than those shown in the FIG. 2, for example there can be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
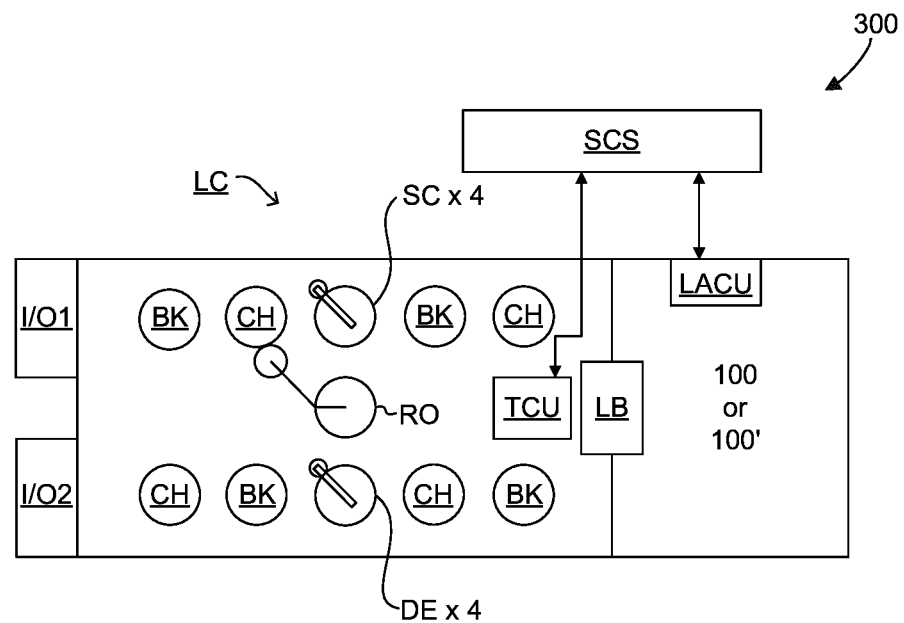
FIG. 3 shows a schematic of a lithographic cell, according to some embodiments.

FIG. 3 shows a lithographic cell 300, also sometimes referred to a lithocell or cluster, according to some embodiments. Lithographic apparatus 100 or 100' can form part of lithographic cell 300. Lithographic cell 300 can also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Exemplary Substrate Stage and Table

Figure 4:
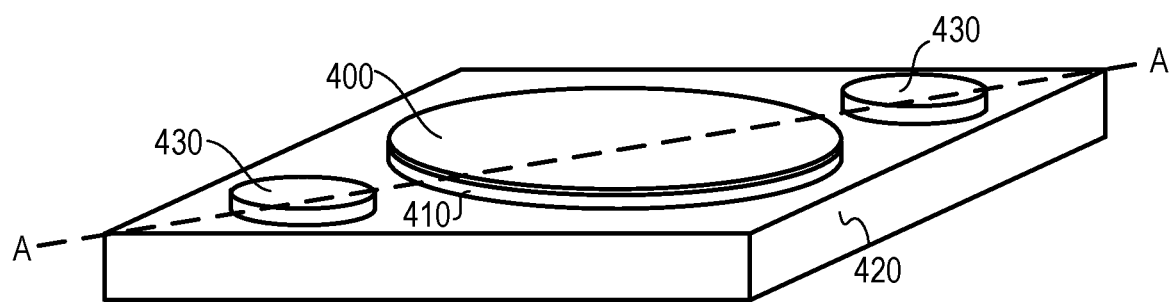
FIG. 4 shows a schematic of a substrate stage, according to some embodiments.

FIG. 4 shows a schematic of a substrate stage 400, according to some embodiments. In some embodiments, substrate stage comprises a substrate table 402, a support block 404, and one or more sensor structures 406. In some embodiments, substrate table 402 comprises a clamp to hold a substrate 408 (e.g., an electrostatic clamp). In some embodiments, each of one or more sensor structures 406 comprises a transmission image sensor (TIS) plate. The TIS plate is a sensor unit that comprises one or more sensors and/or markers for use in a TIS sensing system used for accurate positioning of the wafer relative to the position of a projection system (e.g., projection system PS, FIG. 1) and a mask (e.g., mask MA, FIG. 1) of a lithographic apparatus (e.g., lithographic apparatus 100, FIG. 1). While TIS plates are shown here for illustration, embodiments herein are not limited to any particular sensor. Substrate table 402 is disposed on support block 404. One or more sensor structures 406 are disposed on support block 404.

In some embodiments, substrate 408 is disposed on substrate table 402 when substrate stage 400 supports substrate 408.

Exemplary Non-Uniform Coating and Method

The tables mentioned above (e.g., wafer table WT in FIGS. 1A and 1B, substrate table 402 in FIG. 4) can have flatness tolerances that approach fractions of a micron. Wafers, being relatively thin (e.g., <1 mm thick) compared to its diameter (e.g., >100 mm), are particularly sensitive to unevenness of the substrate table. A warping of a substrate table, even in the order of fractions of a micron, can adversely impact subsequent lithographic and metrology processes performed while using the substrate table—after all, critical dimensions of features in a semiconductor device can approach the sub-nanometer range.

Substrate tables are typically coated with hard alloys (e.g., chromium nitride, titanium nitride, and the like). When a substrate is to undergo a lithographic process, the substrate is disposed and supported on the coated side of the substrate table. The coating is useful for its numerous advantageous tribological properties, for example, friction, wear reduction, and hardness. The coating can increase the performance of substrate tables, for example, by decreasing maintenance requirements and/or extending the life of the substrate table. However, the coating also produces inherent stresses that can bend the substrate table. One method to address the bending of substrate tables is to clamp the substrate tables to a flat support block (e.g., support block 404, FIG. 4). However, the support block clamping method offers only a partial solution to the bending problem of the substrate table. In order to achieve the flatness tolerance required by lithographic and metrology processes, the substrate table can be subjected to one or more flattening/polishing processes. One example of a flattening procedure is ion beam flattening (IBF), a process that can take several hours to multiple days. It is desirable to skip the one or more flattening/polishing procedures, which can save time and improve high-volume manufacturing. Embodiments of the present disclosure provide structures and operations directed to solving issues of coating stresses and bending (or warping, deflecting, distorting) of substrate tables.

Figure 5:
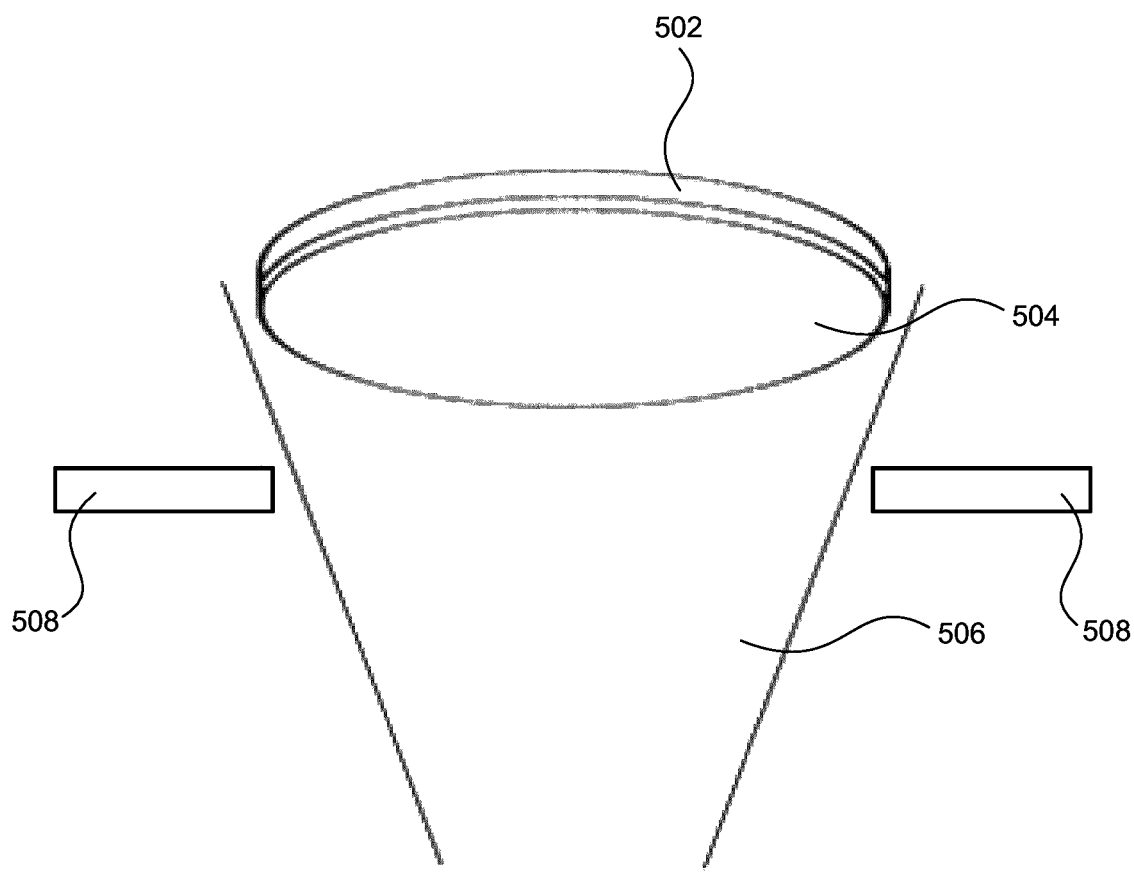
FIG. 5 shows a schematic of a process for depositing a coating on a substrate table, according to some embodiments.

FIG. 5 shows a schematic of a process for depositing a coating 504 on a table base 502, according to some embodiments. In some embodiments, table base 502 is supported to receive coating 504. In some embodiments, a gas plume 506 can be used to dispose coating 504 on a surface of table base 502. The material deposition process can be, for example, a chemical vapor deposition (CVD), an electron-beam deposition, or a thermal deposition process. A material deposition process can use a gas plume 506 to deposit coating 504 onto the surface of table base 502. In some embodiments, the CVD process can be plasma enhanced. The combination of table base 502 with or without coating 504 can be considered a substrate table (e.g., substrate table 402, FIG. 4). Table base 502 is originally substantially flat, prior to receiving coating 504. Particularly, table base 502 comprises a surface that is substantially flat prior to receiving coating 504. In some embodiments, table base 502 comprises a substantially uniform thickness.

As mentioned previously, coating 504 can exert a stress on table base 502 so as to bend table base 502—coating 504 itself is also bent by consequence. Clearer depictions of the bending are provided in FIGS. 6B and 7 and the bent shapes will be discussed later in more detail. To circumvent the effects of the bending, in some embodiments, coating 504 can be disposed with a non-uniform thickness on the surface of table base 502. In some embodiments, the non-uniform thickness can be adjusted by adjusting a gas composition or distribution of gas plume 506. The distribution of material in gas plume 506 can be adjusted during deposition of coating 504 to effect a desired non-uniform thickness profile. In some embodiments, the non-uniform can be adjusted by adjusting one or more blocking elements 508 to selectively mask portions of gas plume 506. Blocking elements 508 can be actuated during deposition of coating 504 to effect a desired non-uniform thickness profile. The actuation of blocking elements 508 can be, for example, radial and/or rotational motions on a plane parallel to the surface of table base 502 to receive coating 504. Thus, a variation of the non-uniform thickness of coating 504 can be controlled through the adjusting of gas plume 506.

The amount of bending experienced by table base 502 can be a function of a stress caused by coating 504 on table base 502. The stress can be either compressive (e.g., pushes outward on table base 502 from its center) or tensile (e.g., pulls inward on table base 502 to its center). A compressive stress results in a bending profile where the coating sits on a convex surface of the table base (e.g., coating is on top of a crest). A tensile stress results in a bending profile where the coating sits on a concave surface of the table base (e.g., coating is in a bowl).

FIG. 6A shows a cross-sectional schematic of a substrate table 600, according to one or more embodiments. Particularly, FIG. 6A shows substrate table 600 in an absence of coating stresses for clarity of discussion. In some embodiments, substrate table 600 comprises a table base 602 and a coating 604. A center line 606 denotes a center of the substrate table along a direction that is analogous to the Z-axis depicted in FIG. 1B. Coating 604 is disposed on table base 602 using any of the processing steps described in reference to FIG. 5. Table base 602 comprises a substantially uniform thickness (e.g., on the drawing page it would be measured vertically, parallel to center line 606). Coating 604 comprises a non-uniform thickness.

In some embodiments, a thickness of table base 602 is approximately 5-15 mm. A diameter or span (e.g., in a plane perpendicular to center line 606) of table base 602 is, for example, approximately 310, 210, or 110 mm. A skilled artisan can envision other diameters according to wafer size standards of the semiconductor industry. Table base 602 can comprise a material such as a ceramic (e.g., silicon carbide), a semiconductor (e.g., silicon), or a glass (e.g. fused silica, XG glass).

To depict the non-uniform thickness of coating 604, surface 608 of coating 604 is indicated. Surface 608 is curved due to how coating 604 was deposited with a non-uniform thickness. In the example shown in FIG. 6A, the non-uniform thickness (or the cross-sectional profile of coating 604) has been varied such that the thickness of coating 604 increases with respect to a distance from center line 606. In some embodiments, the non-uniform thickness is freeform. In some embodiments, an average thickness of coating 604 is approximately 0.5-1.0 micron. Coating 604 can comprise any of chromium nitride, titanium nitride, diamond-like carbon, diamond. The materials of coating 604 are selected for the advantageous properties discussed above (e.g., hardness, friction, wear, etc.).

The non-uniform thickness profile of coating 604 shown in FIG. 6A is selected when anticipating a compressive stress from coating 604, which would result in a convex type of bending at the coated surface of table base 602. The type of stress and bending is typically intrinsic to the material properties of the applied coating. For example, a coating material that has a tendency to generate a compressive stress is diamond-like carbon.

FIG. 6B shows a cross-sectional schematic of substrate table 600 with physical effects included (stresses are on). In some embodiments, substrate table 600 has a deflection 610. As alluded to previously, deflection 610 results in a convex shape of the coated surface of table base 602. That is, coating 604 imparts a deflection to the coated surface of table base 602. Deflection 610 is measured at an edge away from the center of substrate table 600. Deflection 610 is measured with respect to a nominal flatness and parallel to center line 606. In some embodiments, deflection 610 is approximately 0.01-0.05, 0.05-0.1, or 0.1-0.2 micron. In some embodiments, deflection 610 is approximately 0.05 micron or less, 0.1 micron or less, or 0.2 micron or less. In some embodiments, the magnitude of deflection 610 is a function of the diameter or span of substrate table 600. A skilled artisan will appreciate that an amount of deflection will tend to be smaller for a smaller substrate table, assuming other fabrication parameters are substantially identical.

In some embodiments, the non-uniform thickness of coating 604 is selected (or adjusted, controlled, varied) such that surface 608 is substantially flat after the bending, that is, when taking into account deflection 610. In this manner, subsequent and costly flattening/polishing steps can be avoided. Surface 608 is configured to contact a substrate when substrate table supports the substrate, for example, during a lithographic process. The substrate supported against a flat surface ensures accuracy of lithographed devices while the coating protects the substrate and the substrate table.

FIG. 7 shows a cross-sectional schematic of a substrate table 700, according to one or more embodiments. FIG. 7 shows substrate table 700 with physical effects included (stresses are on). The structures in FIG. 7 are labeled so as to coincide with similarly numbered elements in FIGS. 6A and 6B, with an exception of the stress type and direction of bending (left most digit of an element number represents the figure they belong to).

To depict the non-uniform thickness of coating 704, surface 708 of coating 704 is indicated. Surface 708 is curved due to how coating 704 was deposited with a non-uniform thickness. In the example shown in FIG. 7, the non-uniform thickness (or the cross-sectional profile of coating 704) has been varied such that the thickness of coating 704 decreases with respect to a distance from center line 706. In some embodiments, the non-uniform thickness is freeform. In some embodiments, an average thickness of coating 704 is approximately 0.5-1.0 micron. Coating 704 can comprise any of chromium nitride, titanium nitride, diamond-like carbon. The materials of coating 704 are selected for the advantageous properties discussed above (e.g., hardness, friction, wear, etc.).

The non-uniform thickness profile of coating 704 shown in FIG. 7 is selected when anticipating a tensile stress from coating 704, which would result in a concave type of bending at the coated surface of table base 702.

In some embodiments, substrate table 700 has a deflection 710. As alluded to previously, deflection 710 results in a concave shape of the coated surface of table base 702. That is, coating 704 imparts a deflection to the coated surface of table base 702. Deflection 710 is measured at an edge away from the center of substrate table 700. Deflection 710 is measured with respect to a nominal flatness and parallel to center line 706. In some embodiments, deflection 710 is approximately 0.01-0.05, 0.05-0.1, or 0.1-0.2 micron. In some embodiments, deflection 710 is approximately 0.05 micron or less, 0.1 micron or less, or 0.2 micron or less. In some embodiments, the magnitude of deflection 710 is a function of the diameter or span of substrate table 700. A skilled artisan will appreciate that an amount of deflection will tend to be smaller for a smaller substrate table, assuming other fabrication parameters are substantially identical.

In some embodiments, the non-uniform thickness of coating 704 is selected (or adjusted, controlled, varied) such that surface 708 is substantially flat after the bending, that is, when taking into account deflection 710. In this manner, subsequent and costly flattening/polishing steps can be avoided. Surface 708 is configured to contact a substrate when substrate table supports the substrate, for example, during a lithographic process. The substrate supported against a flat surface ensures accuracy of lithographed devices while the coating protects the substrate and the substrate table.

The embodiments may further be described using the following clauses:

1. A method of fabricating a substrate table, the method comprising:
  supporting a table base to receive a coating, wherein the table base comprises a surface that is substantially flat; and
  disposing the coating on the surface with a non-uniform thickness,
  wherein the coating exerts a stress on the table base so as to bend the table base, and
  wherein the non-uniform thickness causes a surface of the coating to become substantially flat after the bending.

2. The method of clause 1, wherein the disposing comprises depositing the coating with a variation to the non-uniform thickness that is a function of a distance from a center of the table base.

3. The method of clauses 1 or 2, wherein the disposing comprises depositing the coating via a chemical vapor deposition process.

4. The method of clause 3, wherein the chemical vapor deposition process is plasma enhanced.

5. The method of any one of clauses 1 to 4, further comprising adjusting a gas distribution during the disposing to control the variation of the non-uniform thickness.

6. The method of any one of clauses 1 to 5, wherein a blocking element is used during the disposing to control the variation of the non-uniform thickness.

7. The method of any one of clauses 1 to 6, wherein the coating imparts a concave shape to the surface of the table base.

8. The method of any one of clauses 1 to 6, wherein the coating imparts a convex shape to the surface of the table base.

9. The method of any one of clauses 1 to 8, wherein the coating imparts a deflection of approximately 0.1 micron or less to the surface of the table base.

10. The method of any one of clauses 1 to 9, wherein the disposing the coating comprises depositing chromium nitride, titanium nitride, diamond-like carbon, diamond, silicon, or silicon carbide.

11. A substrate table for supporting a substrate, the substrate table comprising:
  a table base comprising a surface; and
  a coating having a non-uniform thickness disposed on the surface of the table base,
  wherein a deflection of the table base from a nominal flatness is a function of a stress caused by the coating,
  wherein a cross-section profile of the coating is based on at least the stress and the non-uniform thickness,
  wherein a surface of the coating is substantially flat, and
  wherein the surface of the coating is configured to contact the substrate when the substrate table supports the substrate.

12. The substrate table of clause 11, wherein the non-uniform thickness comprises a variation that is a function of a distance from a center of the table base.

13. The substrate table of clauses 11 or 12, wherein the surface of the table base has a concave shape.

14. The substrate table of any one of clauses 11 to 13, wherein the surface of the table base has a convex shape.

15. The substrate table of any one of clauses 11 to 14, wherein the deflection is approximately 0.1 micron or less from the nominal flatness.

16. The substrate table of any one of clauses 11 to 15, wherein the coating comprises chromium nitride, titanium nitride, diamond-like carbon, silicon, or silicon carbide.

17. A lithographic apparatus comprising:
  an illumination system configured to produce a beam of radiation;
  a support configured to support a patterning device configured to impart a pattern on the beam;
  a projection system configured to project the patterned beam onto a substrate; and
  a substrate table configured to support the substrate, the substrate table comprising:
    a table base comprising a surface; and
    a coating having a non-uniform thickness disposed on the surface of the table base, wherein a deflection of the table base from a nominal flatness is a function of a stress caused by the coating, wherein a cross-section profile of the coating is based on at least the stress and the non-uniform thickness, wherein a surface of the coating is substantially flat, and wherein the surface of the coating is configured to contact the substrate when the substrate table supports the substrate.

18. The lithographic apparatus of clause 17, wherein the non-uniform thickness comprises a variation that is a function of a distance from a center of the table base.

19. The lithographic apparatus of clauses 17 or 18, wherein the surface of the table base has a concave or convex shape.

20. The lithographic apparatus of any one of clauses 17 to 19, wherein the deflection is approximately 0.1 micron or less from a nominal flatness.

In many cases, the amount and type of deflection of a substrate table is fairly predictable. However, metrology can be performed for determining a deposition formula/recipe for a desired non-uniform thickness profile of the coating, which is particularly useful for times when predictable bending is not guaranteed, or when more accurate determinations of deflection are deemed necessary. A metrology method can comprise depositing a coating on a substrate as described in reference to FIG. 5, measuring an amount of deflection, and determining adjustments to coating deposition parameters based on the measured amount of deflection. Measuring the amount of deflection can be performed using a tool that measures topography, for example, a profilometer or an optical microscope that can measure sample height. Additionally, stress information can be determined from the measured deflection (e.g., stress tensor). Adjustments to the coating deposition parameters can be based on stress information to produce a more accurately flat surface after the bending of a substrate table.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the invention in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the invention have been described above, it will be appreciated that the invention can be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. A method comprising:
   supporting a table base, wherein the table base comprises a surface that is substantially flat; and
   disposing a coating on the surface with a non-uniform thickness, wherein the coating exerts a stress on the table base so as to bend the table base, and wherein the non-uniform thickness causes a surface of the coating to become substantially flat after the bending.

2. The method of claim 1, wherein the disposing comprises depositing the coating with a variation to the non-uniform thickness that is a function of a distance from a central portion of the table base.

3. The method of claim 1, wherein the disposing comprises depositing the coating via a chemical vapor deposition process.

4. The method of claim 3, wherein the chemical vapor deposition process is plasma enhanced.

5. The method of claim 1, further comprising adjusting a gas distribution during the disposing to control the variation of the non-uniform thickness.

6. The method of claim 1, wherein a blocking element is used during the disposing to control the variation of the non-uniform thickness.

7. The method of claim 1, wherein the coating imparts a concave shape to the surface of the table base.

8. The method of claim 1, wherein the coating imparts a convex shape to the surface of the table base.

9. The method of any one of claim 1, wherein the coating imparts a deflection of approximately 0.1 micron or less to the surface of the table base.

10. The method of claim 1, wherein the disposing the coating comprises depositing chromium nitride, titanium nitride, diamond-like carbon, diamond, silicon, or silicon carbide.

11. A substrate table for supporting a substrate, the substrate table comprising:
 a table base comprising a surface; and
 a coating having a non-uniform thickness disposed on the surface of the table base,
 wherein a deflection of the table base from a nominal flatness is a function of a stress caused by the coating,
 wherein a cross-section profile of the coating is based on at least the stress and the non-uniform thickness,
 wherein a surface of the coating is substantially flat, and
 wherein the surface of the coating is configured to contact the substrate when the substrate table supports the substrate.

12. The substrate table of claim 11, wherein the non-uniform thickness comprises a variation that is a function of a distance from a central portion of the table base.

13. The substrate table of claim 11, wherein the surface of the table base has a concave shape.

14. The substrate table of claim 11, wherein the surface of the table base has a convex shape.

15. The substrate table of claim 11, wherein the deflection is approximately 0.1 micron or less from the nominal flatness.

16. The substrate table of claim 11, wherein the coating comprises chromium nitride, titanium nitride, diamond-like carbon, silicon, or silicon carbide.

17. A substrate table for supporting a substrate, the substrate table comprising:
 a table base comprising a surface that is substantially flat; and
 a coating having a non-uniform thickness disposed on the surface of the table base,
 wherein the coating exerts a stress on the table base so as to bend the table base, and
 wherein the non-uniform thickness causes a surface of the coating to become substantially flat after the bending.

18. The substrate table of claim 17, wherein the non-uniform thickness comprises a variation that is a function of a distance from a central portion of the table base.

19. The substrate table of claim 17, wherein the surface of the table base has a concave or convex shape.

20. The substrate table of claim 17, wherein the bend is approximately 0.1 micron or less from a nominal flatness.

* * * * *